US009065396B2

(12) United States Patent
Son et al.

(10) Patent No.: US 9,065,396 B2
(45) Date of Patent: Jun. 23, 2015

(54) APPARATUS FOR COMPENSATING FOR DISTORTION OF TRANSMITTER ARRAY IN RADIO COMMUNICATION SYSTEM AND METHOD FOR CONTROLLING THE SAME

(71) Applicant: Samsung Electronics Co. Ltd., Suwon-si, Gyeonggi-do (KR)

(72) Inventors: Mi-Hyun Son, Seoul (KR); Yong-Hoon Kim, Suwon-si (KR); Byung-Tae Yoon, Suwon-si (KR); Jong-Wook Zeong, Seoul (KR); Dong-Geun Lee, Hwaseong-si (KR); Jae-Hun Lee, Daejeon (KR); Song-Cheol Hong, Daejeon (KR)

(73) Assignees: Samsung Electronics Co., Ltd., Suwon-si (KR); Korea Advanced Institute of Science and Technology (KAIST), Daejeon (KR)

( * ) Notice: Subject to any disclaimer, the term of this patent is extended or adjusted under 35 U.S.C. 154(b) by 44 days.

(21) Appl. No.: 13/726,901

(22) Filed: Dec. 26, 2012

(65) Prior Publication Data
US 2013/0163696 A1    Jun. 27, 2013

(30) Foreign Application Priority Data
Dec. 26, 2011    (KR) .................. 10-2011-0141956

(51) Int. Cl.
*H04K 1/02*    (2006.01)
*H04L 25/03*   (2006.01)
*H04L 25/49*   (2006.01)
*H03F 1/32*    (2006.01)
*H04B 1/04*    (2006.01)
*H03F 3/24*    (2006.01)
*H03F 3/68*    (2006.01)

(52) U.S. Cl.
CPC ............ *H03F 1/3241* (2013.01); *H04B 1/0475* (2013.01); *H03F 1/3247* (2013.01); *H03F 1/3294* (2013.01); *H03F 3/24* (2013.01); *H03F 3/68* (2013.01); *H03F 2200/102* (2013.01); *H03F 2200/336* (2013.01); *H04B 2001/0425* (2013.01)

(58) Field of Classification Search
None
See application file for complete search history.

(56) References Cited

U.S. PATENT DOCUMENTS

| 5,038,146 | A | * | 8/1991 | Troychak et al. ............. 342/173 |
| 5,732,333 | A | * | 3/1998 | Cox et al. ...................... 455/126 |
| 2006/0133535 | A1 | * | 6/2006 | Jung et al. ...................... 375/296 |
| 2011/0151806 | A1 | | 6/2011 | Kenington |

* cited by examiner

*Primary Examiner* — Chieh M Fan
*Assistant Examiner* — Wednel Cadeau
(74) *Attorney, Agent, or Firm* — Jefferson IP Law, LLP

(57) ABSTRACT

Provided is a method in which a Digital Pre-Distorter (DPD) performs digital pre-distortion on a received In-phase (I) signal, a received Quadrature-phase (Q) signal, a feedback I signal, and a feedback Q signal; a mixer mixes a signal output from the DPD with a frequency signal output from an oscillator; each of n phase shifters phase-shifts a signal output from the mixer according to a preset beamforming pattern; each of n Power Amplifiers (PAs) amplifies a signal output from an associated phase shifter according to a gain, the PAs connected to the associated phase shifter on a one-to-one basis; each of n envelope detectors detects an envelope signal from a signal output from an associated PA, the envelope detector connected to the associated PA on a one-to-one basis; and a control unit determines whether the n PAs operate normally, using the envelope signals output from the n envelope detectors.

9 Claims, 3 Drawing Sheets

APPARATUS FOR COMPENSATING FOR DISTORTION OF TRANSMITTER ARRAY IN RADIO COMMUNICATION SYSTEM AND METHOD FOR CONTROLLING THE SAME

PRIORITY

This application claims the benefit under 35 U.S.C. §119 (a) of a Korean Patent Application filed in the Korean Intellectual Property Office on Dec. 26, 2011 and assigned Serial No. 10-2011-0141956, the entire disclosure of which is incorporated herein by reference.

JOINT RESEARCH AGREEMENT

The presently claimed invention was made by or on behalf of the below listed parties to a joint research agreement. The joint research agreement was in effect on or before the date the claimed invention was made and the claimed invention was made as a result of activities undertaken within the scope of the joint research agreement. The parties to the joint research agreement are 1) Samsung Electronics Co., Ltd. and 2) Korea Advanced Institute of Science and Technology (KAIST).

BACKGROUND OF THE INVENTION

1. Field of the Invention

The present invention relates to an apparatus for compensating for distortion of a transmitter array in a radio communication system, and a method for controlling the same.

2. Description of the Related Art

Recently, there is an increasing demand for low-carbon and eco-friendly Base Stations (BSs). To meet these demands, BSs are implemented in the form of integration of antennas and Radio Frequency (RF) units.

BSs use a beamforming scheme to efficiently implement high-speed data transmission, and use a transmitter array scheme to use a Multiple Input Multiple Output (MIMO) scheme. For BSs using the transmitter array scheme, all of its multiple modules need to be included in the existing antenna box. Thus, implementing a transmitter array with small low-power RF devices is a new technical challenge.

The transmitter array is implemented in a structure of performing a pre-distortion operation. In this structure, a Digital Pre-Distorter (DPD) is connected to each of Power Amplifiers (PAs) included in the transmitter array on a one-to-one basis to perform the pre-distortion operation.

However, in this structure where a DPD is connected to each of power amplifiers included in the transmitter array to perform a pre-distortion operation, one power amplifier needs to use one DPD, causing an increase in the external size of the transmitter array, an increase in the hardware complexity, and an increase in the cost and power.

SUMMARY OF THE INVENTION

An aspect of exemplary embodiments of the present invention is to provide an apparatus for compensating for distortion of a transmitter array in a radio communication system, and a method for controlling the same.

Another aspect of exemplary embodiments of the present invention is to provide an apparatus for compensating for distortion of a transmitter array using a minimum number of DPDs in a radio communication system, and a method for controlling the same.

Further another aspect of exemplary embodiments of the present invention is to provide an apparatus for compensating for distortion of a transmitter array to minimize the external size of the transmitter array in a radio communication system, and a method for controlling the same.

Yet another aspect of exemplary embodiments of the present invention is to provide an apparatus for compensating for distortion of a transmitter array to minimize the hardware complexity of the transmitter array in a radio communication system, and a method for controlling the same.

Still another aspect of exemplary embodiments of the present invention is to provide an apparatus for compensating for distortion of a transmitter array to minimize the power consumption of the transmitter array in a radio communication system, and a method for controlling the same.

Still another aspect of exemplary embodiments of the present invention is to provide an apparatus for compensating for distortion of a transmitter array to minimize the cost of the transmitter array in a radio communication system, and a method for controlling the same.

In accordance with one aspect of the present invention, there is provided an apparatus for compensating for distortion of a transmitter array in a radio communication system. The apparatus includes a Digital Pre-Distorter (DPD) for performing a digital pre-distortion operation on a received In-phase (I) signal, a received Quadrature-phase (Q) signal, a feedback I signal, and a feedback Q signal; an oscillator for oscillating a preset frequency signal; a mixer for mixing a signal output from the DPD with a signal output from the oscillator; n phase shifters each for phase-shifting a signal output from the mixer according to a preset beamforming pattern; n power amplifiers each connected to an associated phase shifter on a one-to-one basis to amplify a signal output from the phase shifter according to a gain; n envelope detectors each connected to an associated power amplifier on a one-to-one basis to detect an envelope signal from a signal output from the power amplifier; a control unit for determining whether the n power amplifiers operate normally, using the envelope signals output from the n envelope detectors; and an Analog to Digital Converter (ADC) for generating the feedback I signal and the feedback Q signal by Analog to Digital (A/D)-converting a signal output from a specific power amplifier among the n power amplifiers.

In accordance with one aspect of the present invention, there is provided a method for controlling a transmitter array distortion compensation apparatus in a radio communication system. The method includes performing, by a Digital Pre-Distorter (DPD), a digital pre-distortion operation on a received In-phase (I) signal, a received Quadrature-phase (Q) signal, a feedback I signal, and a feedback Q signal; mixing, by a mixer, a signal output from the DPD with a frequency signal output from an oscillator; phase-shifting, by each of n phase shifters, a signal output from the mixer according to a preset beamforming pattern; amplifying, by each of n power amplifiers, a signal output from an associated phase shifter according to a gain, the power amplifier being connected to the associated phase shifter on a one-to-one basis; detecting, by each of n envelope detectors, an envelope signal from a signal output from an associated power amplifier, the envelope detector being connected to the associated power amplifier on a one-to-one basis; and determining by a control unit whether the n power amplifiers operate normally, using the envelope signals output from the n envelope detectors. The feedback I signal and the feedback Q signal are signals which are generated by Analog to Digital (A/D)-converting a signal output from a specific power amplifier among the n power amplifiers by an Analog to Digital Converter (ADC).

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, the same drawing reference numerals will be understood to refer to the same elements, features and structures.

DETAILED DESCRIPTION OF EXEMPLARY EMBODIMENTS

Figure 1:
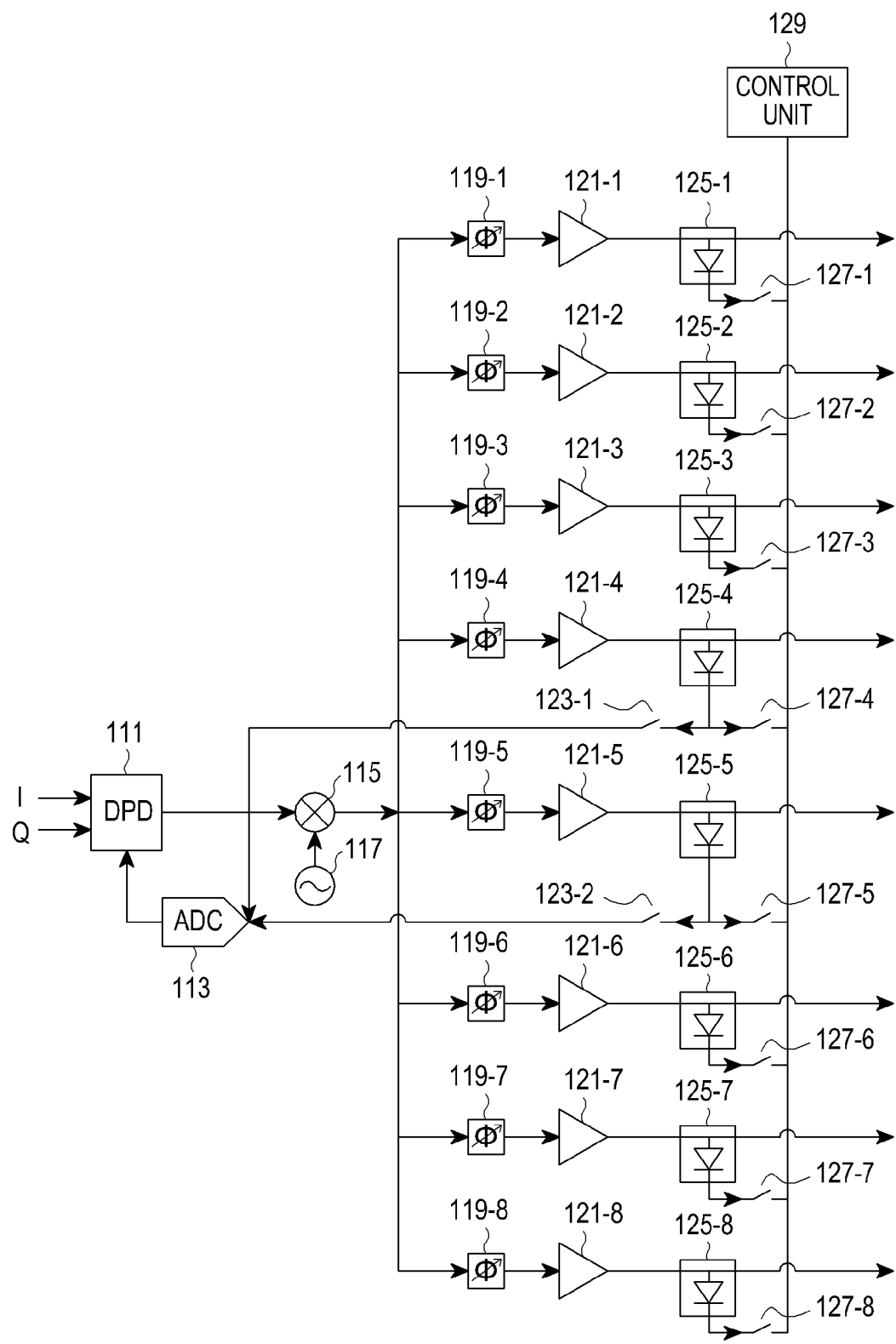
FIG. 1 illustrates an internal structure of an apparatus for compensating for distortion of a transmitter array in a radio communication system according to an embodiment of the present invention.

Preferred embodiments of the present invention will now be described in detail with reference to the accompanying drawings. In the following description, specific details such as detailed configuration and components are merely provided to assist the overall understanding of exemplary embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

An aspect of the present invention provides an apparatus for compensating for distortion of a transmitter array in a radio communication system, and a method for controlling the same.

Another aspect of the present invention provides an apparatus for compensating for distortion of a transmitter array using a minimum number of Digital Pre-Distorter (DPDs) in a radio communication system, and a method for controlling the same.

Further another aspect of the present invention provides an apparatus for compensating for distortion of a transmitter array to minimize the external size of the transmitter array in a radio communication system, and a method for controlling the same.

Yet another aspect of the present invention provides an apparatus for compensating for distortion of a transmitter array to minimize the hardware complexity of the transmitter array in a radio communication system, and a method for controlling the same.

Still another aspect of the present invention provides an apparatus for compensating for distortion of a transmitter array to minimize the power consumption of the transmitter array in a radio communication system, and a method for controlling the same.

Still another aspect of the present invention provides an apparatus for compensating for distortion of a transmitter array to minimize the cost of the transmitter array in a radio communication system, and a method for controlling the same.

In the transmitter array distortion compensation apparatus proposed by the present invention, the transmitter array is implemented to perform an envelope feedback operation only for one of its multiple Power Amplifiers (PAs). The reason why the transmitter array is implemented to perform an envelope feedback operation only for one of its multiple power amplifiers is because the multiple power amplifiers are all the same in structure. Thus, the envelope difference among the multiple power amplifiers is insignificant. Because of the insignificant envelope difference among the multiple power amplifiers, it is possible to consider the results obtained by performing the envelope feedback operation only for one power amplifier as the results obtained by performing the envelope feedback operation for all power amplifiers.

The power amplifier, for which an envelope feedback operation is performed, is a power amplifier located in the center of the multiple power amplifiers. The reason why the power amplifier located in the center is selected as the power amplifier which undergoes the envelope feedback operation is to minimize the phase difference which may occur during a phase shifting operation when the transmitter array uses the beamforming scheme. In order to perform the beamforming operation, the transmitter array needs to perform the phase shifting operation by gradually increasing the shift level starting from the first power amplifier. By performing the envelope feedback operation for the power amplifier located in the center, which has an average phase difference between the first and last power amplifiers, the transmitter array may minimize the envelope difference between the power amplifiers.

Now, reference will be made to FIG. 1 to describe an apparatus for compensating for distortion of a transmitter array in a radio communication system according to an embodiment of the present invention.

FIG. 1 illustrates an internal structure of an apparatus for compensating for distortion of a transmitter array in a radio communication system according to an embodiment of the present invention.

Referring to FIG. 1, the transmitter array distortion compensation apparatus includes a DPD 111, an Analog to Digital Converter (ADC) 113, a mixer 115, an oscillator 117, n (for example, n=8) phase shifters (i.e., first to eighth phase shifters 119-1 to 119-8), eight power amplifiers (i.e., first to eighth power amplifiers 121-1 to 121-8), which are connected to the first to eighth phase shifters 119-1 to 119-8, respectively, eight envelope detectors (i.e., first to eighth envelope detectors 125-1 to 125-8), which are connected to the first to eighth power amplifiers 121-1 to 121-8, respectively, eight switches (i.e., first to eighth switches 127-1 to 127-8), which are connected to the first to eighth envelope detectors 125-1 to 125-8, respectively, and a control unit 129. In addition, the transmitter array includes a ninth switch 123-1 connected to the fourth envelope detector 125-4, and a tenth switch 123-2 connected to the fifth envelope detector 125-5.

A received In-phase (I) signal and a received Quadrature-phase (Q) signal, which are included in a received signal, and an I signal and a Q signal, which are output from the ADC 113, are input to the DPD 111. The DPD 111 performs a digital pre-distortion operation on the received I signal and the received Q signal, and then outputs the results to the mixer 115. The I and Q signals output from the ADC 113 are signals generated by A/D-converting an envelope signal output from the fifth envelope detector 125-5. The DPD 111 performs a digital pre-distortion operation on the received I and Q signals using the I and Q signals output from the ADC 113, i.e., using envelope information of feedback envelope signal.

The mixer 115 mixes a signal output from the DPD 111 with an oscillation frequency signal output from the oscillator 117, and outputs the results to the fifth phase sifter 119-5. The fifth phase sifter 119-5 performs a phase shifting operation on the signal output from the mixer 115 according to a preset beamforming pattern, and then outputs the results to the fifth power amplifier 121-5. The beamforming pattern is generated under control of the control unit 129, and a detailed description of the beamforming pattern will be omitted.

The fifth power amplifier 121-5 power-amplifies the signal output from the fifth phase shifter 119-5 according to a preset gain, and then outputs the results to the fifth envelope detector 125-5. The fifth envelope detector 125-5 detects an envelope signal from the signal output from the fifth power amplifier 121-5, and then outputs the results to the ADC 113 via the tenth switch 123-2 and to the control unit 129 via the fifth switch 127-5.

The signal output from the mixer 115 is input not only to the fifth phase sifter 119-5, but also to each of the first to fourth phase shifters 119-1 to 119-4 and the sixth to eighth phase shifters 119-6 to 119-8.

The first phase shifter 119-1 performs a phase shifting operation on the signal output from the mixer 115 according to the beamforming pattern, and then outputs the results to the first power amplifier 121-1. The first power amplifier 121-1 amplifies the signal output from the first phase shifter 119-1 according to a preset gain, and then outputs the results to the first envelope detector 125-1. The first envelope detector 125-1 detects an envelope signal from the signal output from the first power amplifier 121-1, and then outputs the results to the control unit 129 via the first switch 127-1.

The second phase shifter 119-2 performs a phase shifting operation on the signal output from the mixer 115 according to the beamforming pattern, and then outputs the results to the second power amplifier 121-2. The second power amplifier 121-2 amplifies the signal output from the second phase shifter 119-2 according to a preset gain, and then outputs the results to the second envelope detector 125-2. The second envelope detector 125-2 detects an envelope signal from the signal output from the second power amplifier 121-2, and then outputs the results to the control unit 129 via the second switch 127-2.

The third phase shifter 119-3 performs a phase shifting operation on the signal output from the mixer 115 according to the beamforming pattern, and then outputs the results to the third power amplifier 121-3. The third power amplifier 121-3 amplifies the signal output from the third phase shifter 119-3 according to a preset gain, and then outputs the results to the third envelope detector 125-3. The third envelope detector 125-3 detects an envelope signal from the signal output from the third power amplifier 121-3, and then outputs the results to the control unit 129 via the third switch 127-3.

The fourth phase shifter 119-4 performs a phase shifting operation on the signal output from the mixer 115 according to the beamforming pattern, and then outputs the results to the fourth power amplifier 121-4. The fourth power amplifier 121-4 amplifies the signal output from the fourth phase shifter 119-4 according to a preset gain, and then outputs the results to the fourth envelope detector 125-4. The fourth envelope detector 125-4 detects an envelope signal from the signal output from the fourth power amplifier 121-4, and then outputs the results to the control unit 129 via the fourth switch 127-4.

The sixth phase shifter 119-6 performs a phase shifting operation on the signal output from the mixer 115 according to the beamforming pattern, and then outputs the results to the sixth power amplifier 121-6. The sixth power amplifier 121-6 amplifies the signal output from the sixth phase shifter 119-6 according to a preset gain, and then outputs the results to the sixth envelope detector 125-6. The sixth envelope detector 125-6 detects an envelope signal from the signal output from the sixth power amplifier 121-6, and then outputs the results to the control unit 129 via the sixth switch 127-6.

The seventh phase shifter 119-7 performs a phase shifting operation on the signal output from the mixer 115 according to the beamforming pattern, and then outputs the results to the seventh power amplifier 121-7. The seventh power amplifier 121-7 amplifies the signal output from the seventh phase shifter 119-7 according to a preset gain, and then outputs the results to the seventh envelope detector 125-7. The seventh envelope detector 125-7 detects an envelope signal from the signal output from the seventh power amplifier 121-7, and then outputs the results to the control unit 129 via the seventh switch 127-7.

The eighth phase shifter 119-8 performs a phase shifting operation on the signal output from the mixer 115 according to the beamforming pattern, and then outputs the results to the eighth power amplifier 121-8. The eighth power amplifier 121-8 amplifies the signal output from the eighth phase shifter 119-8 according to a preset gain, and then outputs the results to the eighth envelope detector 125-8. The eighth envelope detector 125-8 detects an envelope signal from the signal output from the eighth power amplifier 121-8, and then outputs the results to the control unit 129 via the eighth switch 127-8.

The control unit 129 may determine whether the first to eighth power amplifiers 121-1 to 121-8 operate normally, using the envelope signals output from the first to eights envelope detectors 125-1 to 125-8. Specifically, if there is an abnormal envelope signal among the envelope signals output from the first to eighth envelope detectors 125-1 to 125-8, the control unit 129 determines that a power amplifier connected to the envelope detector that has output the abnormal envelope signal is abnormal. There may be a variety of ways to detect an abnormal envelope signal by the control unit 129, and a detailed description thereof will be omitted. Upon detecting the existence of the abnormal power amplifier, the control unit 129 performs a self-healing operation of increasing a supply voltage of the remaining power amplifiers except for the abnormal power amplifier.

Although it is assumed in FIG. 1 that an envelope signal output from the fifth envelope detector 125-5 is input to the DPD 111 via the ADC 113 and the DPD 111 performs a digital pre-distortion operation on the envelope signal, it will be apparent to those of ordinary skill in the art that the fifth power amplifier 121-5 may operate abnormally. If the fifth power amplifier 121-5 operates abnormally in this way, the digital pre-distortion operation is not performed for the received I and Q signals. Therefore, if the fifth power amplifier 121-5 operates abnormally, the control unit 129 outputs the signal obtained by envelope-detecting the signal output from the fourth power amplifier 121-4 replacing the fifth power amplifier 121-5, i.e., outputs the signal output from the fourth envelope detector 125-4, to the ADC 113 via the ninth switch 123-1, allowing the DPD 111 to perform a digital pre-distortion operation on the signal output from the fourth power amplifier 121-4.

Also, the control unit 129 may control a switch on/off operation of the first to eighth switches 127-1 to 127-8 and the ninth and tenth switches 123-1 and 123-2.

In the case where the transmitter array distortion compensation apparatus is implemented as described in conjunction with FIG. 1, the transmitter array may normally operate even though the envelope feedback operation is performed only for one power amplifier, making it possible to decrease the hardware complexity of the transmitter array distortion compensation apparatus, decrease the external size thereof, minimize its realization cost, minimize the power consumption, and facilitate operation of the DPD. It will be apparent to those of ordinary skill in the art that the transmitter array distortion compensation apparatus shown in FIG. 1 may be implemented in a single chip.

Although it is assumed in FIG. 1 that the feedback I and Q signals, which are input to the DPD, are generated by A/D-converting the signal output from the envelope detector, these signals may be generated by demodulating a signal output from a coupler, filtering the demodulated signals using Low Path Filters (LPFs), and A/D-converting the filtered signals. A description thereof will be made below with reference to FIG. 2.

Figure 2:
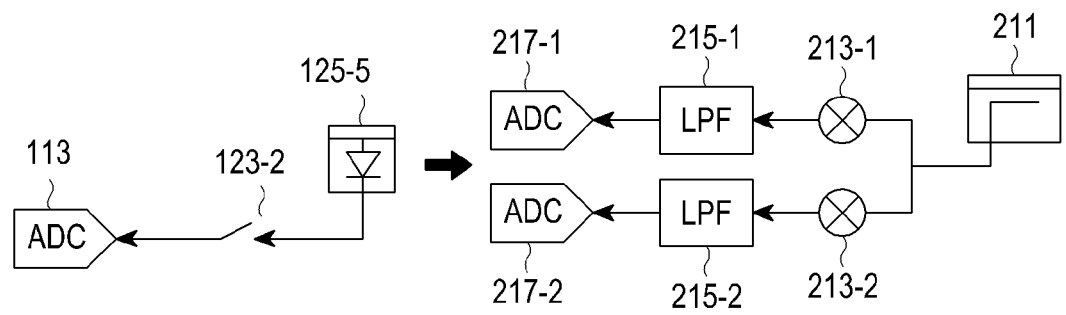
FIG. 2 illustrates an envelope signal feedback structure capable of replacing the envelope signal feedback structure in FIG. 1.

FIG. 2 illustrates an envelope signal feedback structure capable of replacing the envelope signal feedback structure in FIG. 1.

Referring to FIG. 2, although the envelope signal feedback structure in FIG. 1 is implemented to include the fifth envelope detector 125-5, the tenth switch 123-2 and the ADC 113, this envelope signal feedback structure may be replaced with a structure including a coupler 211, a first demodulator 213-1, a second demodulator 213-2, a first LPF 215-1, a second LPF 215-2, a first ADC 217-1, and a second ADC 217-2.

Specifically, a signal output from the fifth power amplifier 121-5 is output to each of the first and second demodulators 213-1 and 213-2 after being coupled in the coupler 211. The first demodulator 213-1 demodulates a signal output from the coupler 211 according to a preset demodulation scheme, and outputs the results to the first LPF 215-1. The first LPF 215-1 filters a signal output from the first demodulator 213-1, and outputs the results to the first ADC 217-1. The first ADC 217-1 A/D-converts a signal output from the first LPF 215-1, and outputs the results to the DPD 111. Specifically, the signal output from the first ADC 217-1 is a feedback I signal.

The second demodulator 213-2 demodulates a signal output from the coupler 211 according to a preset demodulation scheme, and outputs the results to the second LPF 215-2. The second LPF 215-2 filters a signal output from the second demodulator 213-2 and outputs results to the second ADC 217-2. The second ADC 217-2 A/D-converts a signal output from the second LPF 215-2, and outputs the results to the DPD 111. Specifically, the signal output from the second ADC 217-2 is a feedback Q signal.

Next, reference will be made to FIG. 3 to describe an operation of the transmitter array distortion compensation apparatus in FIG. 1.

Figure 3:
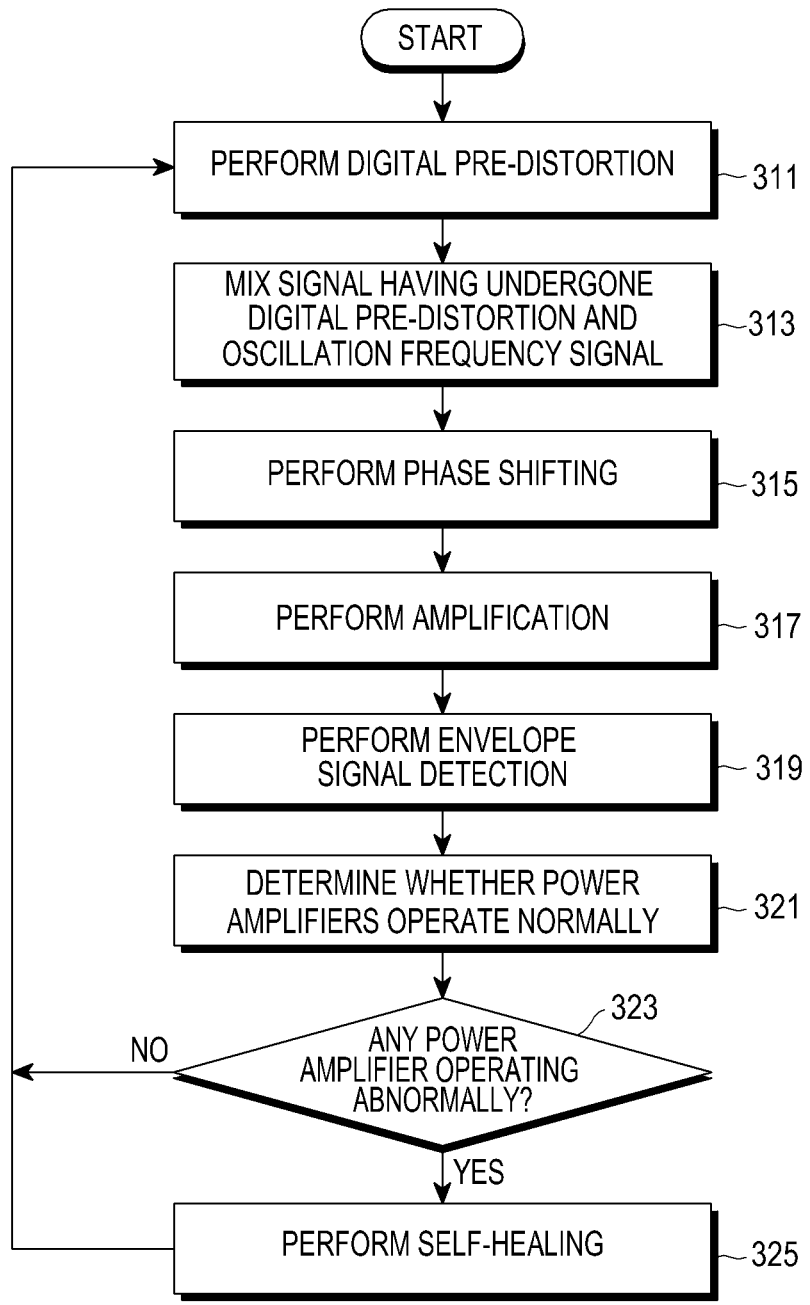
FIG. 3 is a flowchart illustrating an operation of the transmitter array distortion compensation apparatus in FIG. 1.

FIG. 3 is a flowchart illustrating an operation of the transmitter array distortion compensation apparatus in FIG. 1.

Referring to FIG. 3, in step 311, the transmitter array distortion compensation apparatus performs a digital pre-distortion operation on the received I and Q signals and the feedback I and Q signals by means of the DPD 111. In step 313, the transmitter array distortion compensation apparatus mixes the signal having undergone the digital pre-distortion operation with an oscillation frequency signal output from the oscillator 117 by means of the mixer 115. In step 315, the transmitter array distortion compensation apparatus phase-shifts the signal output from the mixer 115 according to a preset beamforming pattern by means of the first to eighth phase shifters 119-1 to 119-8. In step 317, the transmitter array distortion compensation apparatus amplifies the signals phase-shifted by the first to eighth phase shifters 119-1 to 119-8 according to a preset gain by means of their associated power amplifiers, i.e., the first to eights power amplifiers 121-1 to 121-8.

In step 319, the transmitter array distortion compensation apparatus detects envelope signals from the signals amplified by the first to eighth power amplifiers 121-1 to 121-8 by means of their associated envelope detectors, i.e., the first to eights envelope detectors 125-1 to 125-8. In step 321, the transmitter array distortion compensation apparatus determines whether each of the first to eighth power amplifiers 121-1 to 121-8 operates normally, using the envelope signals detected by the first to eighth envelope detectors 125-1 to 125-8.

In step 323, the transmitter array distortion compensation apparatus determines whether there is a power amplifier that operates abnormally. If there is a power amplifier that operates abnormally, the transmitter array distortion compensation apparatus performs a self-healing operation of increasing a supply voltage of the remaining power amplifiers except for the power amplifier that operates abnormally, in step 325.

As is apparent from the foregoing description, the present invention makes it possible to compensate for distortion of a transmitter array using only one DPD in a radio communication system, contributing to the decrease in the hardware complexity and external size of the transmitter array, and to the minimization of the cost for implementing the transmitter array and the power consumption required in the transmitter array, and facilitating operation of the DPD.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for compensating for distortion of a transmitter array in a radio communication system, the apparatus comprising:
    a Digital Pre-Distorter (DPD) configured to perform a digital pre-distortion operation on a received In-phase (I) signal, a received Quadrature-phase (Q) signal, a feedback I signal, and a feedback Q signal;
    an oscillator configured to oscillate a preset frequency signal;
    a mixer configured to mix a signal output from the DPD with a signal output from the oscillator;
    n phase shifters each for phase-shifting a signal output from the mixer according to a preset beamforming pattern;
    n power amplifiers each connected to an associated phase shifter on a one-to-one basis to amplify a signal output from the phase shifter according to a gain;
    n envelope detectors each connected to an associated power amplifier on a one-to-one basis to detect an envelope signal from a signal output from the power amplifier;
    a control unit configured to determine whether the n power amplifiers operate normally, using the envelope signals output from the n envelope detectors, and to perform a self-healing operation of increasing a supply voltage of remaining power amplifiers except for at least one power amplifier that operates abnormally among the n power amplifiers if there is the at least one power amplifier that operates abnormally; and
    an Analog to Digital Converter (ADC) configured to generate the feedback I signal and the feedback Q signal by Analog to Digital (A/D)-converting a signal output from a specific power amplifier among the n power amplifiers, wherein the specific power amplifier is a power amplifier located in the center of the n power amplifiers.

2. The apparatus of claim 1, wherein if it is determined that the specific power amplifier operates abnormally, the control unit controls to change a signal input to the ADC to an output signal of any one of the remaining power amplifiers except for the specific power amplifier among the n power amplifiers.

3. The apparatus of claim 1, further comprising n switches each connected between an associated envelope detector and the control unit;

wherein the control unit controls a switch on/off operation of the switches.

4. The apparatus of claim 1, further comprising a switch connected between the specific power amplifier and the ADC;

wherein the control unit controls a switch on/off operation of the switch, and controls to the switch to be switched off if the specific power amplifier operates abnormally.

5. The apparatus of claim 2, further comprising:

a first switch connected between the specific power amplifier and the ADC; and a second switch connected between the any one power amplifier and the ADC;

wherein the control unit controls a switch on/off operation of the first and second switches, and if the specific power amplifier operates abnormally, the control unit controls the first switch to be switched off, and the second switch to be switched on.

6. A method for controlling a transmitter array distortion compensation apparatus in a radio communication system, the method comprising:

performing, by a Digital Pre-Distorter (DPD), a digital pre-distortion operation on a received In-phase (I) signal, a received Quadrature-phase (Q) signal, a feedback I signal, and a feedback Q signal;

mixing, by a mixer, a signal output from the DPD with a frequency signal output from an oscillator;

phase-shifting, by each of n phase shifters, a signal output from the mixer according to a preset beamforming pattern;

amplifying, by each of n power amplifiers, a signal output from an associated phase shifter according to a gain, the power amplifier being connected to the associated phase shifter on a one-to-one basis;

detecting, by each of n envelope detectors, an envelope signal from a signal output from an associated power amplifier, the envelope detector being connected to the associated power amplifier on a one-to-one basis; and determining by a control unit whether the n power amplifiers operate normally, using the envelope signals output from the n envelope detectors, and performing a self-healing operation of increasing a supply voltage of remaining power amplifiers except for at least one power amplifier that operates abnormally among the n power amplifiers if there is the at least one power amplifier that operates abnormally, wherein the feedback I signal and the feedback Q signal are signals which are generated by Analog to Digital (A/D)-converting a signal output from a specific power amplifier among the n power amplifiers by an Analog to Digital Converter (ADC), and wherein the specific power amplifier is a power amplifier located in the center of the n power amplifiers.

7. The method of claim 6, further comprising, if it is determined that the specific power amplifier operates abnormally, controlling by the control unit to change a signal input to the ADC to an output signal of any one of the remaining power amplifiers except for the specific power amplifier among the n power amplifiers.

8. The method of claim 6, further comprising controlling, by the control unit, a switch on/off operation of a switch connected between the specific power amplifier and the ADC;

wherein the controlling a switch on/off operation of the switch comprises controlling the switch to be switched off if the specific power amplifier operates abnormally.

9. The method of claim 7, further comprising controlling, by the control unit, a switch on/off operation of a first switch connected between the specific power amplifier and the ADC and a second switch connected between the any one power amplifier and the ADC;

wherein the controlling a switch on/off operation of the first and second switches comprises controlling the first switch to be switched off and the second switch to be switched on if the specific power amplifier operates abnormally.

\* \* \* \* \*